United States Patent
Wu

[11] Patent Number: 6,063,680
[45] Date of Patent: May 16, 2000

[54] MOSFETS WITH A RECESSED SELF-ALIGNED SILICIDE CONTACT AND AN EXTENDED SOURCE/DRAIN JUNCTION

[75] Inventor: Shye-Lin Wu, Hsinchu, Taiwan

[73] Assignee: Texas Instruments - Acer Incorporated, Hsinchu, Taiwan

[21] Appl. No.: 09/025,969

[22] Filed: Feb. 19, 1998

[51] Int. Cl.[7] .................................................. H01L 21/822
[52] U.S. Cl. ................ 438/303; 438/589; 438/621; 438/683; 438/756; 438/770
[58] Field of Search ................... 438/775, 197, 438/229, 663, 142, 165, 299, 301, 649, 664, 770, 453, 443, 756, 225, 297, 362, 439, 583, 230, 621, 683, 303, 589; 257/288, 350, 900, 297, 902, 382, 412, 647

[56] References Cited

U.S. PATENT DOCUMENTS

| | | | |
|---|---|---|---|
| 4,912,061 | 3/1990 | Nasr | 438/44 |
| 5,412,246 | 5/1995 | Dobuzinsky et al. | 257/632 |
| 5,491,099 | 2/1996 | Hsu | 438/35 |
| 5,612,240 | 3/1997 | Chang | 438/44 |
| 5,656,853 | 8/1997 | Ooishi | 257/647 |
| 5,661,056 | 8/1997 | Takeuchi | 438/261 |
| 5,683,922 | 11/1997 | Jeng et al. | 438/41 SM |
| 5,700,707 | 12/1997 | Lee | 438/52 |
| 5,744,835 | 4/1998 | Inoue | 257/336 |
| 5,789,802 | 8/1998 | Tripsas | 257/607 |
| 5,817,562 | 10/1998 | Chang et al. | 438/305 |
| 5,818,085 | 10/1998 | Hsu et al. | 257/347 |
| 5,831,319 | 11/1998 | Pan | 257/408 |
| 5,843,817 | 12/1998 | Lee et al. | 438/239 |

*Primary Examiner*—Olik Chaudhuri
*Assistant Examiner*—Kurt Eaton
*Attorney, Agent, or Firm*—Harness, Dickey & Pierce, P.L.C.

[57] ABSTRACT

The method of the present invention includes forming a silicon dioxide layer, a first conductive layer and a first oxide layer on a silicon substrate to define a gate region of transistors. Then, a pad oxide layer is formed on the silicon substrate and a second oxide layer is formed on a side of the first conductive layer. Subsequently, a nitride spacer and a third oxide layer are formed, respectively. Then, the third oxide layer and the first oxide layer are removed. Next, a first metal layer is deposited on the silicon substrate and a source/drain/gate implantation is performed via ion implantation. Subsequently, a silicidation process is used to convert portions of the first metal layer into a silicide layer and then unreacted portions of the first metal layer and the nitride spacer are removed. Next, an ion implantation is performed to form an extended source/drain junction. Then, a fourth oxide layer is formed. Next, the fourth oxide layer is condensed and the silicide layer is annealed into a stable phase by rapid thermal process (RTP). Finally, metallization is performed.

24 Claims, 4 Drawing Sheets

MOSFETS WITH A RECESSED SELF-ALIGNED SILICIDE CONTACT AND AN EXTENDED SOURCE/DRAIN JUNCTION

FIELD OF THE INVENTION

The present invention relates to Metal Oxide Semiconductor Field Effect Transistors (MOSFETs), and especially to a method of fabricating MOSFETs with a recessed self-aligned silicide contact and an extended source/drain junction.

BACKGROUND OF THE INVENTION

Recently, the progress of semiconductor technology has driven the integrated circuits technologies toward Ultra Large Scale Integration (ULSI). In ULSI, some negative effects result from the higher integration of devices and the smaller scale of devices. Following the example of MOSFETs, the sheet resistance between the source and drain will increase when the integration of devices is high. It is adverse for high speed operation of MOSFETs. Moreover, the "short channel effect" will occur when the scale of devices is small.

So, the self-aligned silicide (SALICIDE) technology is widely used to increase the packing density of ULSI circuits and to reduce the interconnect for high speed operation. One of several articles relating to the self-aligned silicide (SALICIDE) technology have been prepared. Such articles include, for example, "A Thermally Stable Ti—W Salicide for Deep-Submicron Logic with Embedded DRAM, 1996, IEEE, IEDM 96-451. This above article sets forth that Ti-5% W salicide has high-thermal stability up to 800° C. as well as sheet resistance for 0.18 $\mu$m devices. However, the SALICIDE process will result in a higher junction leakage due to the metal penetration into the Si substrate to spike the junction and/or the residual metal or silicide across the lightly doped drain (LDD) spacer causing a bridge effect between the adjacent devices. Another article relating to the above problems is "Process Limitation and Device Design Tradeoffs of Self-Aligned $TiSi_2$ Junction Formation in Sub-micrometer CMOS Devices, "IEEE TRANSACTIONS ON ELECTRON DEVICES, Vol.38. No.2. February. 1991.

As for "short channel effect", it could be improved by using the extended ultra-shallow source/drain junction. A further article relating to the above problems is "A 0.05 $\mu$m-CMOS with Ultra Shallow Source/Drain Junctions Fabricated by 5 Kev Ion Implantation and Rapid Thermal Annealing, "1994, IEEE, IEDM 94-485.

So, solving the above-described problems is required.

SUMMARY OF THE INVENTION

According to one embodiment of the present invention, a single crystal silicon substrate with a <100> crystallographic orientation is provided. A field oxide region is grown on the substrate to provide isolation between devices on the substrate. Then, a silicon dioxide layer, a first conductive layer and a first oxide layer are formed on the silicon substrate, respectively. Then, portions of the silicon dioxide layer, the first conductive layer and the first oxide layer are removed via lithography and etching to define a gate region of transistors. Next, a pad oxide layer is grown on the silicon substrate and a second oxide layer is grown on a side of the first conductive layer to recover the etching damages.

Then, a nitride spacer is formed on a side of the gate region and a third oxide layer is formed in the silicon substrate. The third oxide layer is removed to form a recessed surface on the silicon substrate. Then, the first oxide layer is removed. Next, a first metal layer is deposited on the silicon substrate and then a source/drain/gate implantation is performed via ion implantation. Subsequently, a silicidation process is used to convert portions of the first metal layer into the silicide layer, portions of the first metal layer on the field oxide and on a side of the nitride spacer being unreacted. Then, the unreacted portions of the first metal layer are removed. Next, an ion implantation is performed to form an extended source/drain junction. Subsequently, a fourth oxide layer is formed. Next, the fourth oxide layer is condensed and the silicide layer is annealed into a stable phase by rapid thermal process (RTP). Then, portions of the fourth oxide layer are removed to form a contact hole. Subsequently, a second metal layer is deposited on the fourth oxide layer and in the contact hole. Finally, portions of the second metal layer are removed.

DETAILED DESCRIPTION OF THE PREFERRED EMBODIMENT

The present invention discloses a method of fabricating MOSFETs with a recessed self-aligned silicide contact and an extended source/drain junction. A more detailed description of the present invention is described below.

Figure 1:
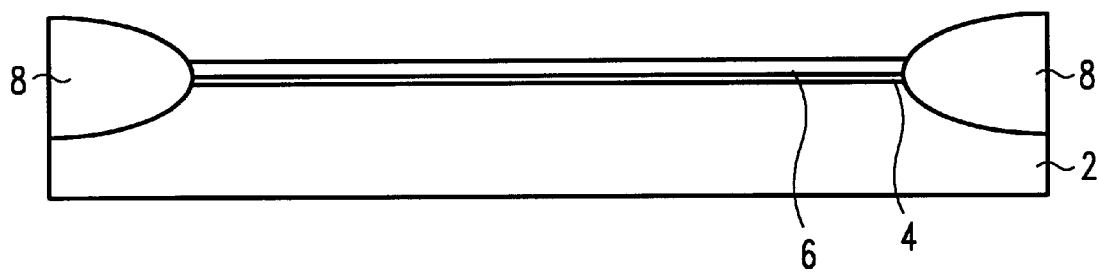
FIG. 1 is a cross-sectional view of forming a silicon dioxide layer, a nitride layer and a field oxide region on a silicon substrate in accordance with the present invention.

Referring to FIG. 1, a single crystal silicon substrate 2 with a <100> crystallographic orientation is provided. A silicon dioxide layer 4 is grown on the silicon substrate 2 by using a thermal oxidation process. A silicon nitride layer 6 is deposited on the silicon dioxide layer 4 by using low pressure chemical vapor deposition (LPCVD). Then, portions of the silicon nitride layer 6 are removed. A field oxide region 8 is grown on the silicon substrate 2 via lithography and etching steps to etch a silicon nitride-silicon dioxide composition layer by thermal oxidation process. The field oxide region 8 can provide isolation between devices on the substrate 2.

Figure 2:
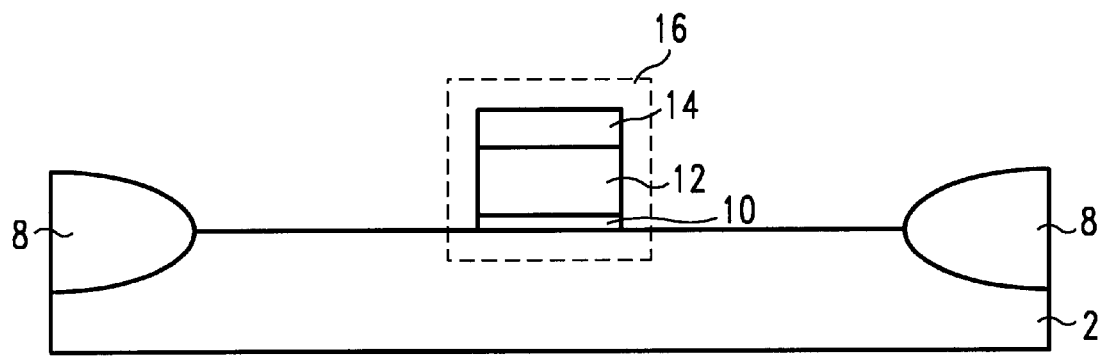
FIG. 2 is a cross-sectional view of defining a gate region of transistors in accordance with the present invention.
Figure 3:
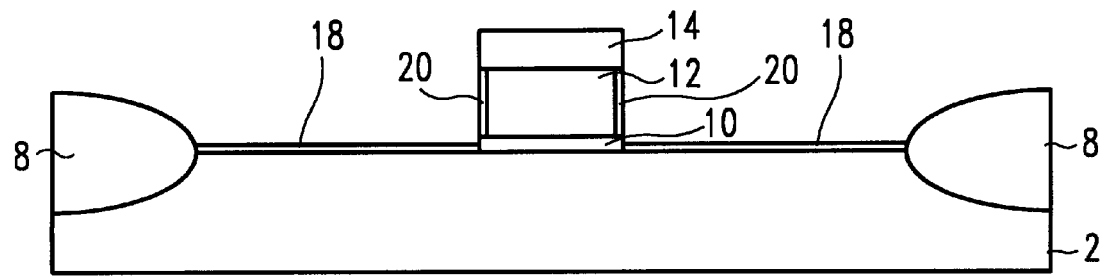
FIG. 3 is a cross-sectional view of forming a pad oxide layer on the silicon substrate and a second oxide layer on a side of the first conductive layer to recover the etching damages in accordance with the present invention.

Referring to FIG. 2, the silicon dioxide layer 4 and the silicon nitride layer 6 are removed via an etching step. Then, a silicon dioxide layer 10 is grown by thermal oxidation process on the silicon substrate 2. The silicon dioxide layer 10 is used as the gate oxide. Then, a first conductive layer 12 is formed on the field oxide region 8 and the silicon dioxide layer 10 via LPCVD. Next, a first oxide layer 14 is formed on the first conductive layer via LPCVD. Then, portions of the silicon dioxide layer 10, the first conductive layer 12 and the first oxide layer 14 are removed via lithography and etching. A gate region of transistors 16 can thus be defined. In a preferred embodiment, the first conductive layer 12 comprises doped polysilicon. The thickness of the first conductive layer 12 is about 500–5000 angstroms. The first oxide layer 14 is formed of tetra-ethyl-ortho-silicate (TEOS) oxide. The thickness of the first oxide layer 14 is about 300–1500 angstroms. Referring to FIG. 3, a pad oxide layer 18 is grown on the silicon substrate 2 and a second oxide layer 20 is grown on a side of the first conductive layer 12 by using a thermal oxidation process in the $N_2O$ or NO ambient to recover the etching damages. Preferably, the temperature of the thermal oxidation process is about 750–1100° C., the thickness of the pad oxide layer 18 is about 20–150 angstroms and the thickness of the second oxide layer 20 is about 40–250 angstroms.

Figure 4:
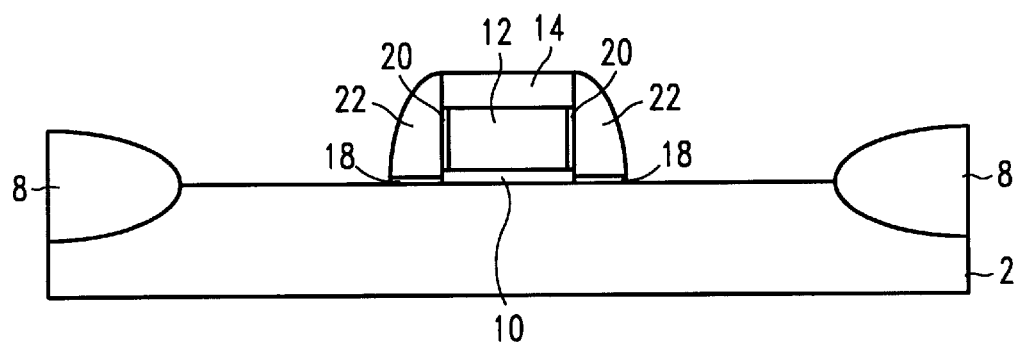
FIG. 4 is a cross-sectional view of forming a nitride spacer on a side of the gate region in accordance with the present invention.
Figure 5:
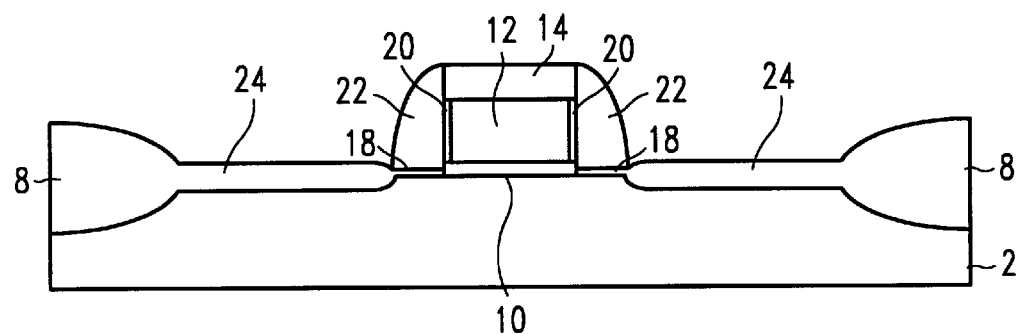
FIG. 5 is a cross-sectional view of forming a third oxide layer in the silicon substrate in accordance with the present invention.

Turning to FIG. 4, a first nitride layer 22 is deposited on the field region 8, the pad oxide layer 18 and the gate region of transistors 16. Then, portions of the first nitride layer 22 and the pad oxide layer are removed to form a nitride spacer 22. In one embodiment of the present invention, the thickness of the first nitride layer 22 is about 500–2000 angstroms. The first nitride layer 22 is deposited using LPCVD or PECVD systems. Referring to FIG. 5, a third oxide layer 24 is grown in the silicon substrate 2 by a thermal oxidation process. In one embodiment of the present invention, the temperature of a thermal oxidation process is about 800–1100° C., the thickness of the third oxide layer 24 is about 300–2000 angstroms.

Figure 6:
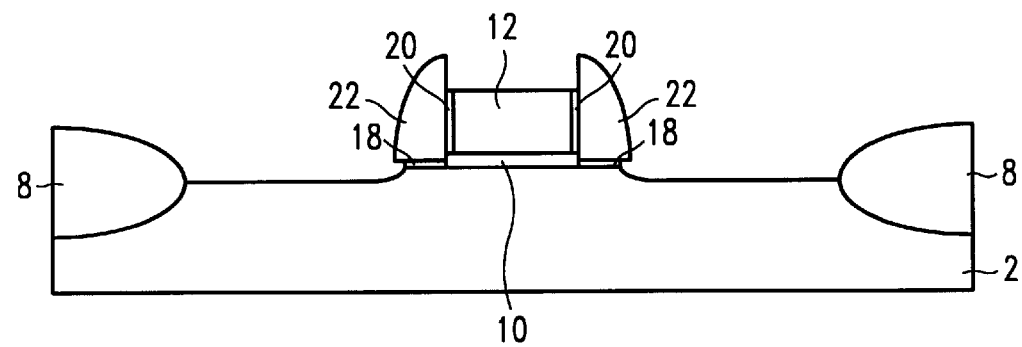
FIG. 6 is a cross-sectional view of removing the third oxide layer and the first oxide layer in accordance with the present invention.

Referring to FIG. 6, the third oxide layer 24 is removed to form a recessed surface on the silicon substrate 2. Then, the first oxide layer 14 is removed. Preferably, the etching step is by wet etching and the etchant of the etching is Buffer Oxide Etching (BOE) solution.

Figure 7:
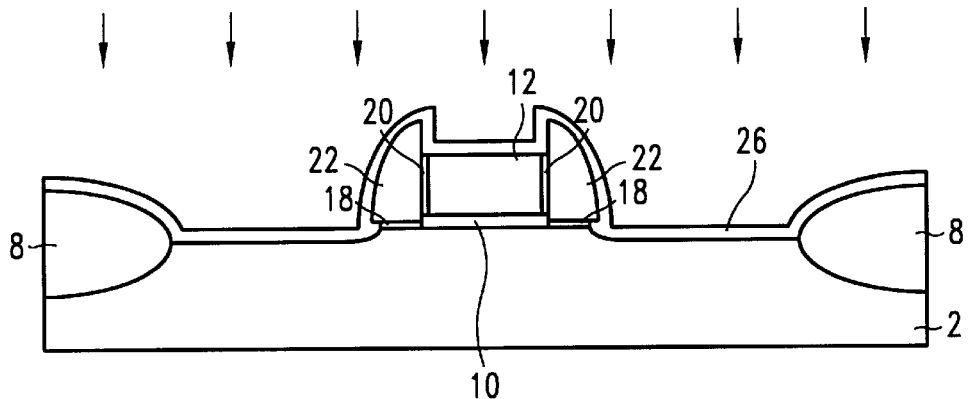
FIG. 7 is a cross-sectional view of depositing a first metal layer and then performing a source/drain/gate via ion implantation in accordance with the present invention.

Turning to FIG. 7, a first metal layer 26 is deposited on the silicon substrate 2 and then a source/drain/gate implantation is performed via ion implantation. In one embodiment of the present invention, the first metal layer 26 is Ti, W, Co, Pt, Ni or Cr. The first metal layer 26 is deposited by using PVD or CVD systems. The thickness of the first metal layer 26 is about 100–1000 angstroms. The energy of ion implantation is about 10–120 KeV. The dosage of implantation is about $10^{14}$–$5*10^{16}$ cm$^{-2}$.

Figure 8:
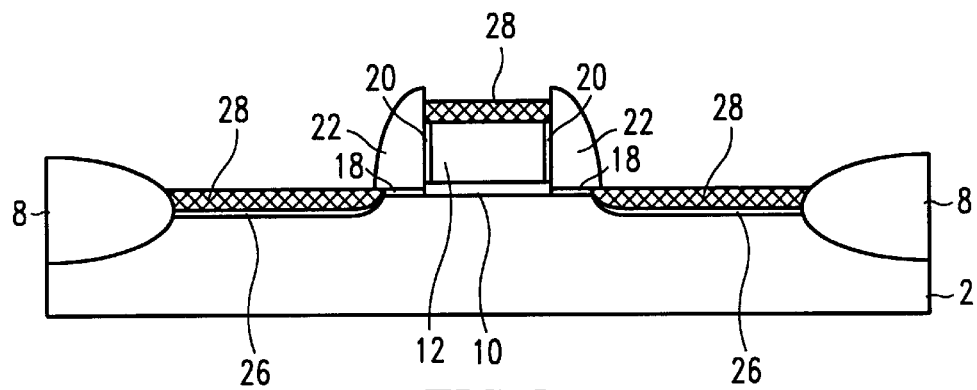
FIG. 8 is a cross-sectional view of converting portions of the first metal layer into a silicide layer and then removing the unreacted portions of the first metal layer in accordance with the present invention.

Referring to FIG. 8, a silicidation process is used to convert portions of the first metal layer 26 into the silicide layer 28, portions of the first metal 26 on the field 8 and on a side of the nitride spacer 22 being unreacted. Then, the unreacted portions of the first metal 26 are removed. Preferably, the temperature of the silicidation process is about 350–700° C. The unreacted portions of the first metal 26 are removed by chemical wet etching solution.

Figure 9:
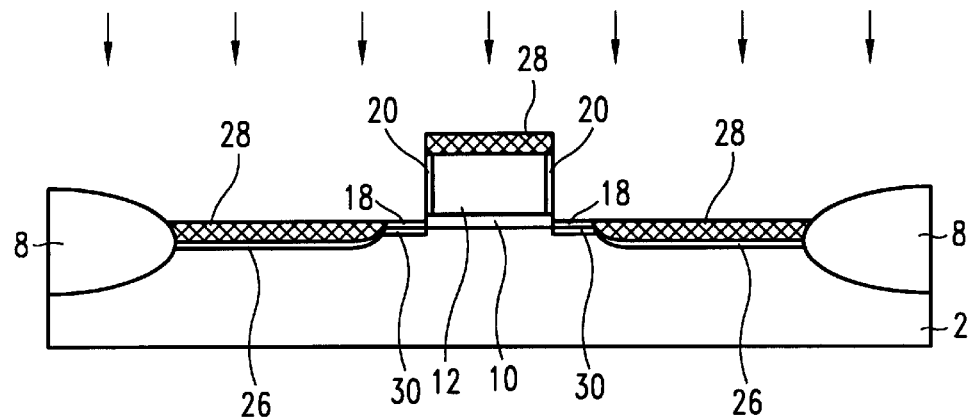
FIG. 9 is a cross-sectional view of removing the nitride spacer and then performing an ion implantation to form an extended source/drain junction in accordance with the present invention.

Referring to FIG. 9, the nitride spacer 22 is remove by hot $H_3PO_4$ solution. Then, an ion implantation is performed to form an extended source/drain junction 30. Preferably, the energy an dosage of the ion implantation are about 0.5–30KeV and $5*10^{13}$–$2*10^{15}$ cm$^{-2}$, respectively.

Figure 10:
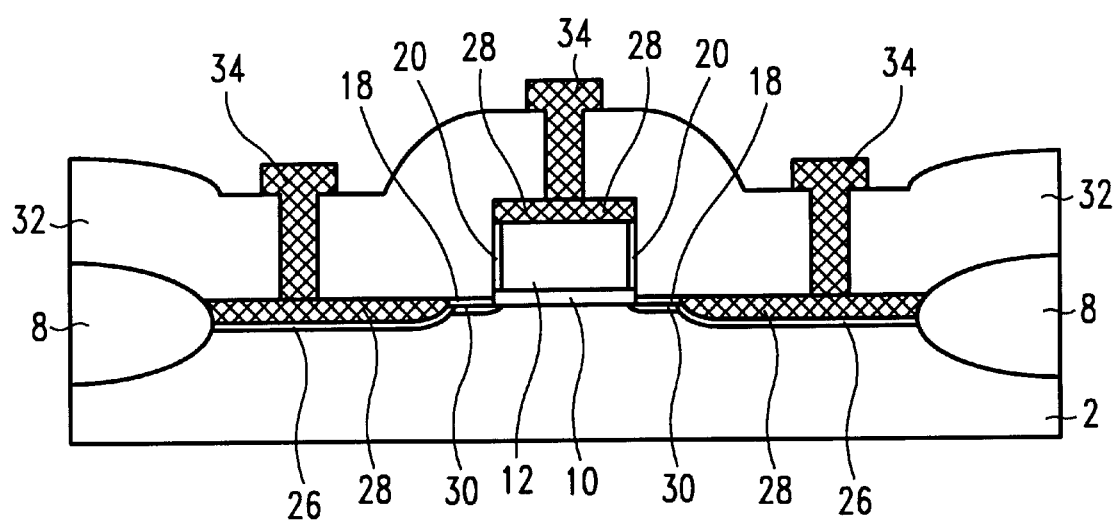
FIG. 10 is a cross-sectional view of depositing a fourth oxide layer and then performing the metallization in accordance with the present invention.

Turning to FIG. 10, a fourth oxide layer 32 is deposited by LPCVD or PECVD systems. Then, the fourth oxide layer 32 is condensed and the silicide layer 28 is annealed into a stable phase by rapid thermal process (RTP). Then, portions of the fourth oxide layer 32 are removed via lithography and etching processes to form a contact hole. Then, a second metal layer 34 is deposited on the fourth oxide layer 32 and in the contact hole. Finally, portions of the second metal layer 34 are removed. In one embodiment of the present invention, the temperature of thermal oxidation is about 700–950° C., the time of thermal oxidation is about 10–60 minutes. The second metal layer 34 is Al, W, Ct, Ti, Pt, Cr, or Ni.

The benefits of the present invention are increasing the operation speed by using the self-aligned silicide source/drain contact and improving the short channel effect by using the extended ultra-shallow source/drain junctions.

As will be understood by a person skilled in the art, the foregoing preferred embodiment of the present invention is illustrative of the present invention rather than limiting of the present invention. Although the preferred embodiment of the invention has been illustrated and described, it will be obvious to those skilled in the art that various changes can be made therein without departing from the spirit which is intended to be limited solely by the appended claims.

I claim:

1. A method of fabricating metal oxide semiconductor field effect transistors (MOSFETs) with a recessed self-aligned silicide contact and an extended source/drain junction, said method comprising the steps of:

forming a field oxide region on a silicon substrate;

forming a silicon dioxide layer on said silicon substrate and said field oxide region;

forming a first conductive layer on said silicon dioxide layer;

forming a first oxide layer on said first conductive layer;

removing portions of said silicon dioxide layer, said first conductive layer and said first oxide layer via lithography and etching processes to define a gate region;

forming a pad oxide layer on said silicon substrate and a second oxide layer on a side of said first conductive layer to recover the etching damages;

forming a first nitride layer on said field oxide region, said pad oxide layer and said gate region;

removing portions of said first nitride layer and said pad oxide layer via lithography and etching processes to form a nitride spacer;

forming a third oxide layer in said silicon substrate;

removing said third oxide layer to perform a recessed surface on said silicon substrate;

removing said first oxide layer;

forming a first metal layer on said silicon substrate;

performing a source/drain/gate implantation via ion implantation;

using a silicidation process to convert portions of said first metal layer into a silicide layer, portions of said first metal layer on said field oxide layer and on a side of said nitride spacer being unreacted;

removing the unreacted portions of said first metal layer;

removing said nitride spacer;

performing an ion implantation to form extended source and drain junctions;

forming a fourth oxide layer on said silicon substrate;

annealing said fourth oxide layer and said silicide layer;

removing portions of said fourth oxide layer via lithography and etching processes to form a contact hole;

forming a second metal layer on said fourth oxide layer and in said contact hole; and removing portions of said second metal layer via lithography and etching processes.

2. The method of claim 1, wherein said first conductive layer comprises doped polysilicon.

3. The method of claim 1, wherein said first oxide layer comprises tetra-ethyl-ortho-silicate (TEOS) oxide.

4. The method of claim 1, wherein said pad oxide layer and said second oxide layer are grown by using a thermal oxidation process in the $N_2O$ or NO ambient.

5. The method of claim 4, wherein the temperature of said thermal oxidation process is about 750–1100° C.

6. The method of claim 1, wherein said pad oxide layer comprises silicon dioxide.

7. The method of claim 1, wherein said second oxide layer comprises polysilicon oxide.

8. The method of claim 1, wherein said first nitride layer is formed by LPCVD or PECVD systems.

9. The method of claim 1, wherein portions of said first nitride layer and said pad oxide layer are removed by etching back process.

10. The method of claim 1, wherein said third oxide layer is formed by thermal oxidation.

11. The method of claim 10, wherein the temperature of said thermal oxidation process is about 800–1100° C.

12. The method of claim 1, wherein said third oxide layer and said first oxide layer are removed by a wet etching process.

13. The method of claim 12, wherein the etchant of said wet etching process comprises Buffer Oxide Etching (BOE) solution.

14. The method of claim 1, wherein said first metal layer comprises Ti, W, Co, Pt, Ni, or Cr.

15. The method of claim 1, wherein the temperature of said silicidation process is about 350–700° C.

16. The method of claim 1, wherein the unreacted portions of said first metal layer and said nitride spacer are removed by chemical wet etching solution.

17. The method of claim 1, wherein said fourth oxide layer is formed by LPCVD or PECVD systems.

18. The method of claim 1, wherein said fourth oxide layer and said silicide layer are annealed by furnace thermal annealing process.

19. The method of claim 18, wherein the temperature of said furnace thermal annealing process is about 700–950° C.

20. The method of claim 18, wherein the time of said furnace thermal annealing process is about 5–60 minutes.

21. The method of claim 1, wherein said fourth oxide layer and said silicide layer are annealed by rapid thermal process (RTP).

22. The method of claim 21, wherein the temperature of said rapid thermal process (RTP) is about 700–1100° C.

23. The method of claim 21, wherein the time of said rapid thermal process (RTP) is about 10–180 seconds.

24. The method of claim 1, wherein said second metal layer comprises Al, Cu, W, Ti, Pt, Cr or Ni.

* * * * *